United States Patent
Halsey et al.

(10) Patent No.: US 6,750,155 B2
(45) Date of Patent: Jun. 15, 2004

(54) METHODS TO MINIMIZE MOISTURE CONDENSATION OVER A SUBSTRATE IN A RAPID CYCLE CHAMBER

(75) Inventors: Harlan I. Halsey, Woodside, CA (US); David E. Jacob, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 10/113,014

(22) Filed: Mar. 28, 2002

(65) Prior Publication Data

US 2003/0172508 A1 Sep. 18, 2003

Related U.S. Application Data

(60) Provisional application No. 60/311,065, filed on Aug. 8, 2001.

(51) Int. Cl.$^7$ ............................................. H01L 21/469

(52) U.S. Cl. ........................ 438/758; 438/908; 414/220; 29/25.01; 118/719; 156/345.31

(58) Field of Search ........................ 438/908; 414/220; 29/25.01; 118/719; 156/345.31

(56) References Cited

U.S. PATENT DOCUMENTS

| | | | |
|---|---|---|---|
| 5,205,051 A | 4/1993 | Hurwitt | |
| 5,455,082 A | 10/1995 | Saito et al. | |
| 6,086,362 A | * 7/2000 | White et al. | 432/243 |
| 6,286,230 B1 | * 9/2001 | White et al. | 34/403 |

* cited by examiner

*Primary Examiner*—George Fourson
*Assistant Examiner*—Thanh Pham
(74) *Attorney, Agent, or Firm*—Martine & Penilla, LLP

(57) ABSTRACT

A chamber for transitioning a semiconductor substrate between modules operating at different pressures is provided. The chamber includes a base defining an outlet. The outlet permits removal of an atmosphere within the chamber to create a vacuum. A substrate support for supporting a semiconductor substrate within the chamber is included. A chamber top having an inlet is included. The inlet is configured to allow for the introduction of a gas into the chamber to displace moisture in a region defined above the substrate support. Sidewalls extending from the base to the chamber top are included. The sidewalls include access ports for entry and exit of a semiconductor substrate from the chamber. A method for conditioning an environment above a region of a semiconductor substrate within a pressure varying interface is also provided.

17 Claims, 6 Drawing Sheets

METHODS TO MINIMIZE MOISTURE CONDENSATION OVER A SUBSTRATE IN A RAPID CYCLE CHAMBER

CROSS REFERENCE TO RELATED APPLICATION

This application claims priority from U.S. Provisional Patent Application No. 60/311,065 filed Aug. 8, 2001 and entitled "Top Vent With Nitrogen Purge, Rapid Cycle Chamber." This provisional application is herein incorporated by reference.

BACKGROUND OF THE INVENTION

The invention relates generally to semiconductor fabrication and more specifically to a semiconductor processing chamber designed to remove and preclude moisture from a region above a semiconductor substrate within the chamber in order to rapidly transition between pressure states within the chamber.

Semiconductor manufacturing systems are constantly being designed with an eye towards improving throughput. For example, processing chambers have been configured in the form of a cluster tool in order to permit the integration of multiple steps of a process. These systems generally include other chambers for handling and transporting wafers between modules operating at atmospheric pressure and vacuum to ensure a clean process environment and improve throughput by eliminating the need to vent the processing chamber during wafer transfer steps. During the processing of a semiconductor substrate, the substrate is transported into and out of a load lock, which is a chamber that cycles between vacuum and atmospheric pressure. When the substrate is placed in the load lock from an atmospheric transfer module (ATM), the load lock will be at atmospheric pressure. The air in the load lock is then pumped out to provide a vacuum in the load lock chamber. The substrate is then transported to the processing chamber via a vacuum transfer module by a robotic arm. The processing operation (e.g., etching, oxidation, chemical vapor deposition, etc.) is then performed in the processing chamber.

After the substrate has been processed, the robotic arm in the vacuum transfer module moves the substrate back to the load lock, which is in a vacuum condition from the transfer discussed above. Once the substrate is placed in the load lock, the pressure in the load lock is brought back to atmospheric pressure by venting in a gas such as nitrogen ($N_2$). When atmospheric pressure has been achieved, the processed substrate is transported to a substrate cassette for other processing steps, if necessary. In semiconductor processing, the value of a process system depends to a large extent on the rate at which substrates can be processed. That is, a process system with a higher throughput will produce more processed substrates in a given amount of time than a system with lower process rate. Thus, the process system with the highest throughput is the more desirable system with all other features being equal.

However, the throughput of semiconductor process systems depends largely on the speed with which chambers, such as a load lock, can be cycled between low and high pressure. For the cluster architecture described above, the load lock is the chamber transitioning between different pressure states, therefore, the time to cycle the load lock is crucial to the system throughput. Unfortunately, the cycle speed of a load lock chamber in conventional process systems is generally limited by the rate at which the load lock can be cycled between a vacuum state and an atmospheric state without depositing particles on a substrate. In particular, the transition from an atmospheric pressure to a vacuum state inside the chamber is limited by the rate at which vacuum is pulled in the chamber. That is, condensation of moisture is avoided by limiting the rate at which a vacuum is pulled in the chamber. Moisture, in the form of airborne water vapor, will condense as the temperature drops below the dew point temperature as the vacuum is pulled. The individual water droplets can nucleate about a particle entrapped in the air and, because of the weight of the nucleated mass, fall onto the substrate if the vacuum is pulled at too fast of a rate. The water is eventually boiled off as vacuum is pulled, however, the particle is left on the surface of the substrate as a contaminate which may eventually lead to device failure. The contaminated substrate can negatively impact semiconductor yields.

FIG. 1 is a schematic diagram of a load lock. Load lock 100 includes access ports 102, bottom vacuum port 104, and bottom vent port 106. Within load lock 100, is wafer support 110 having pads 112 on which a semiconductor substrate 108 rests on when inside the load lock. Of course, pads 112 can be pins. It will be appreciated by one skilled in the art, that load lock 100 transitions between differing pressure states. For example, if wafer 108 has been processed, then the wafer 108 is typically introduced into load lock 100 under a vacuum state. The vacuum state is then broken through the introduction of gas through bottom vent port 106. Once the pressure in load lock 100 is brought to an atmospheric pressure, the wafer is then transferred out of load lock 100 to an atmosphere transport module. If wafer 108 is unprocessed, then the wafer is introduced into load lock 100 from an atmospheric transport module to the load lock while the load lock is at atmospheric pressure. Load lock 100 is then pumped out through vacuum port 104 to create a vacuum within the load lock.

However, one of the shortcomings of the design of load lock 100 is that when either of access ports 102 are open, external moisture from outside the load lock will enter through either of the open access ports. Thus, when load lock 100 is pumped out to create a vacuum, moisture 116, i.e., water vapor, that has entered the chamber through access ports 102 will reside in a region 114 over wafer 108. As mentioned above, if a vacuum in the load lock is pulled too quickly, water vapor 116 will condense in region 114. This condensation can nucleate around a particle in region 114 and eventually fall onto a surface of wafer 108, thereby contaminating the wafer.

An additional shortcoming with the design of load lock 100 is that when a gas is vented in through bottom vent port 106, particulate matter which has fallen to the chamber bottom in the vicinity of the chamber inlet of bottom vent port 106 can be entrained in the gas flow. That is, any sufficiently light particulate matter on the bottom of chamber 100 can be kicked up during a venting operation. Thus, the entrained particulate matter can deposit on a substrate within the load lock thereby leading to lower yields.

One attempt to solve the problem of the condensation falling on top of the surface of wafer 108, is to restrict the rate at which a vacuum is pulled within load lock 100. That is, a vacuum is pulled in two steps, with the first step at a slower rate, so as not to cross a dew point to avoid creating condensation. However, restricting the vacuum rate also restricts the throughput of the system.

In view of the foregoing, there is a need to improve the cycling rate of the load lock between pressure states to allow for a higher throughput without exposing a substrate to contaminants.

SUMMARY OF THE INVENTION

Broadly speaking, the present invention fills these needs by providing a chamber capable of rapidly cycling between differing pressure states without exposing a wafer inside the chamber to contaminates. The present invention also provides a method for conditioning an environment above the wafer inside the chamber.

In accordance with one aspect of the present invention, a method for conditioning an environment in a region defined above a semiconductor substrate within a pressure varying interface is provided. The method initiates with a semiconductor substrate being introduced through an access port into a pressure varying interface. The pressure varying interface is at a first pressure. Then, moisture from a region defined above the semiconductor substrate is displaced. In one embodiment, the moisture is displaced by introducing a dry fluid through a top vent port of the pressure varying interface. Next, the access port is closed. Then, a pressure within the pressure varying interface is transitioned to a second pressure. Next, the semiconductor substrate is transferred from the pressure varying interface.

In accordance with another aspect of the invention, a method for minimizing moisture in a region above a semiconductor substrate in a chamber is provided. The method initiates with providing a vent port extending through a top surface of a chamber. Then, a vacuum port extending through a bottom surface of the chamber is provided. Next, moisture is inhibited from entering a region defined over a semiconductor substrate positioned on a support within the chamber. Then, a pressure within the chamber is transitioned to a vacuum, wherein condensation forms outside of the region defined over the semiconductor substrate during the transition to a vacuum.

In accordance with another aspect of the present invention, a chamber for transitioning a semiconductor substrate between modules operating at different pressures is provided. The chamber includes a base defining an outlet. The outlet permits removal of an atmosphere within the chamber to create a vacuum. A substrate support for supporting a semiconductor substrate within the chamber is included. A chamber top having an inlet is included. The inlet is configured to allow for the introduction of a gas into the chamber to displace moisture in a region defined above the substrate support. Sidewalls extending from the base to the chamber top are included. The sidewalls include access ports for entry and exit of a semiconductor substrate from the chamber.

In accordance with yet another aspect of the present invention, a system for processing a semiconductor substrate is provided. The system includes a first transfer module configured to operate at a first pressure and a second transfer module configured to operate at a second pressure. A pressure varying interface in communication with the first and the second transfer modules is included. The pressure varying interface is capable of transitioning between the first and the second pressures. The pressure varying interface includes a top vent port and a bottom vacuum port. The top vent port is configured to introduce a fluid into the pressure varying interface, wherein the introduction of the fluid displaces moisture in a region defined above a semiconductor substrate in the pressure varying interface.

It is to be understood that the foregoing general description and the following detailed description are exemplary and explanatory only and are not restrictive of the invention, as claimed.

BRIEF DESCRIPTION OF THE DRAWINGS

The accompanying drawings, which are incorporated in and constitute part of this specification, illustrate exemplary embodiments of the invention and together with the description serve to explain the principles of the invention.

DETAILED DESCRIPTION OF THE PREFERRED EMBODIMENTS

Figure 1:
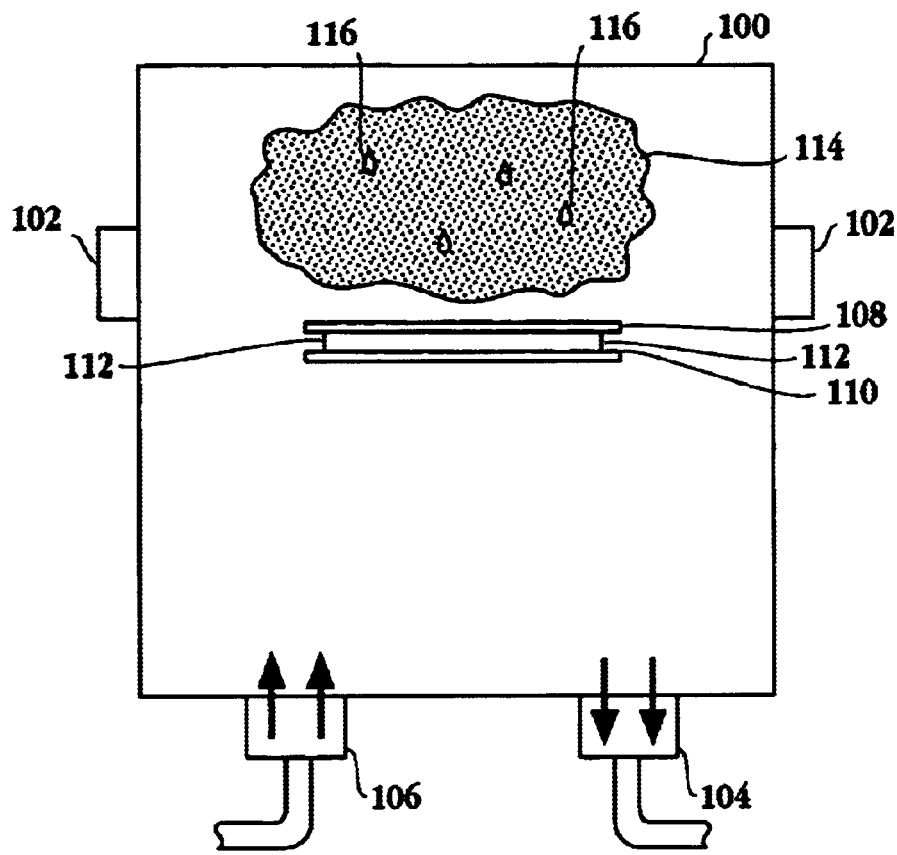
FIG. 1 is a schematic diagram of a load lock used for semiconductor manufacturing operations.

Several exemplary embodiments of the invention will now be described in detail with reference to the accompanying drawings. FIG. 1 is discussed above in the "Background of the Invention" section.

The embodiments of the present invention provide a method and apparatus allowing for the application of an unrestricted vacuum pull down rate by removing moisture from a region defined over a semiconductor substrate within the load lock. By locating a vent port above the wafer, rather than below the wafer, a gas purge is provided to remove moisture from above the wafer and to prevent moisture from flowing into the region of the wafer when the access ports to the external atmosphere of a pressure transition chamber, such as a load lock, are open. In one embodiment, the gas purge is dry, i.e., substantially free from moisture. As used herein, the terms wafer and substrate are used interchangeably. The vacuum pull down rate is no longer restricted since the condensation of moisture above the substrate is no longer a concern. That is, the gas purge forces any moisture to a region in the chamber that is below the substrate, and downstream of the evacuation flow relative to the substrate, thereby removing any concern associated with crossing the dew point. In addition, the substrate is positioned close to the vent port inlet defined in the top of the chamber to reduce the area between the top of the chamber and the substrate. Thus, the gas purge more effectively conditions the region above the substrate since the volume defined above the substrate and below the chamber top is minimized.

Figure 2:
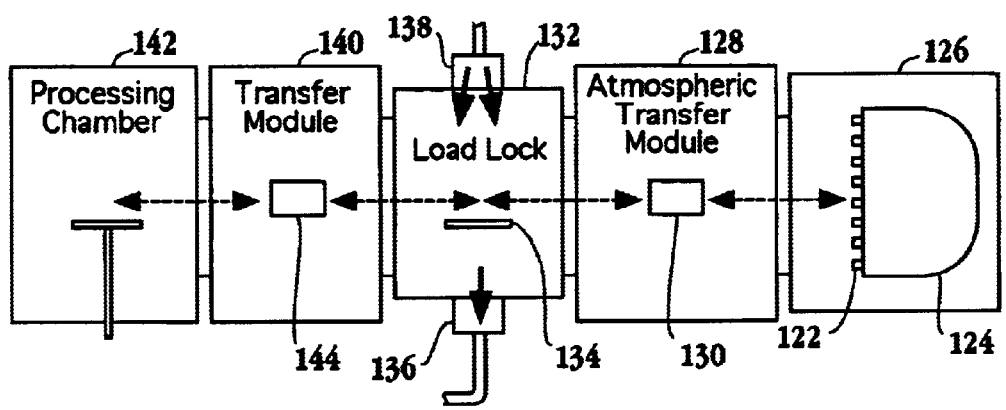
FIG. 2 is a schematic overview diagram of an exemplary semiconductor processing system with wafer handling automation including a load lock having a top vent port in accordance with one embodiment of the invention.

FIG. 2 is a schematic overview diagram of an exemplary semiconductor processing system with wafer handling automation including a load lock having a top vent port in accordance with one embodiment of the invention. To streamline wafer processing, one or more unprocessed wafers 122 are placed in a wafer cassette 124, which is then placed in a load port 126. A robotic arm 130 in an atmospheric transfer module (ATM) 128 picks up a wafer 122 from the cassette 124. Both load port 126 and ATM 128 are at atmospheric pressure. The robotic arm 130 transfers unprocessed wafer 122 from ATM 128 to wafer support 134 within load lock 132. It should be appreciated that load lock 132 is at atmospheric pressure. Then, a vacuum is pulled in load lock 132 by pumping the air out of the load lock chamber through vacuum port 136. Of course, the access doors to load lock 132 are closed during vacuum pull down operations. Once a vacuum condition is established in load lock 132 an access port between vacuum transfer module 140 and the load lock is opened. Wafer 122 is then transported by robot arm 144 from wafer support 134 through vacuum transfer module 140 to processing chamber 142. After wafer 122 has been processed, the wafer is removed from processing chamber 142 through vacuum transfer module 140 into load lock 132. Load lock 132 is brought to atmospheric pressure by venting a gas into the load lock through top vent port 138 until atmospheric pressure is obtained in the load lock chamber. The processed wafer is then transferred to cassette 124 through ATM 128 by robotic arm 130. One skilled in the art will appreciate that more than one wafer can reside in load lock 132 at the same time. For example, as a wafer is placed from vacuum transfer module 140 to load lock 132, an unprocessed wafer may be inside the load lock. Thus, robotic arm 144 can place a processed wafer in load lock 132 and remove an unprocessed wafer for processing. In one embodiment, one semiconductor substrate is in load lock 132 during pump and vent sequences. It should be appreciated that throughput is optimized here as processing chamber 142 does not sit idle waiting for wafers. One skilled in the art will appreciate that the equalization of the load lock pressure to atmosphere is precisely controlled. That is, the sudden pressure adjustment may result in mixing, thereby causing a higher moisture content over the wafer. The precise control of the equalization of the load lock pressure is achieved through the venting process and avoids the turbulence inside the chamber so that particles are not kicked up.

Still referring to FIG. 2, vent port 138 is located on the top of load lock 132 in order to create an environment that is substantially moisture-free above and upstream of the substrate support 134. Additionally, by locating top vent port 138 on the top surface of load lock 132, air entering load lock 132 is prevented from occupying a region defined above substrate 134 and below top vent port 138, as will be explained in more detail below. While the embodiments discussed herein refer to transitioning the pressure within load lock 132 between a vacuum and atmospheric pressure, it should be appreciated that the load lock described herein can include any chamber for any system that operates between two pressures.

Figure 3:
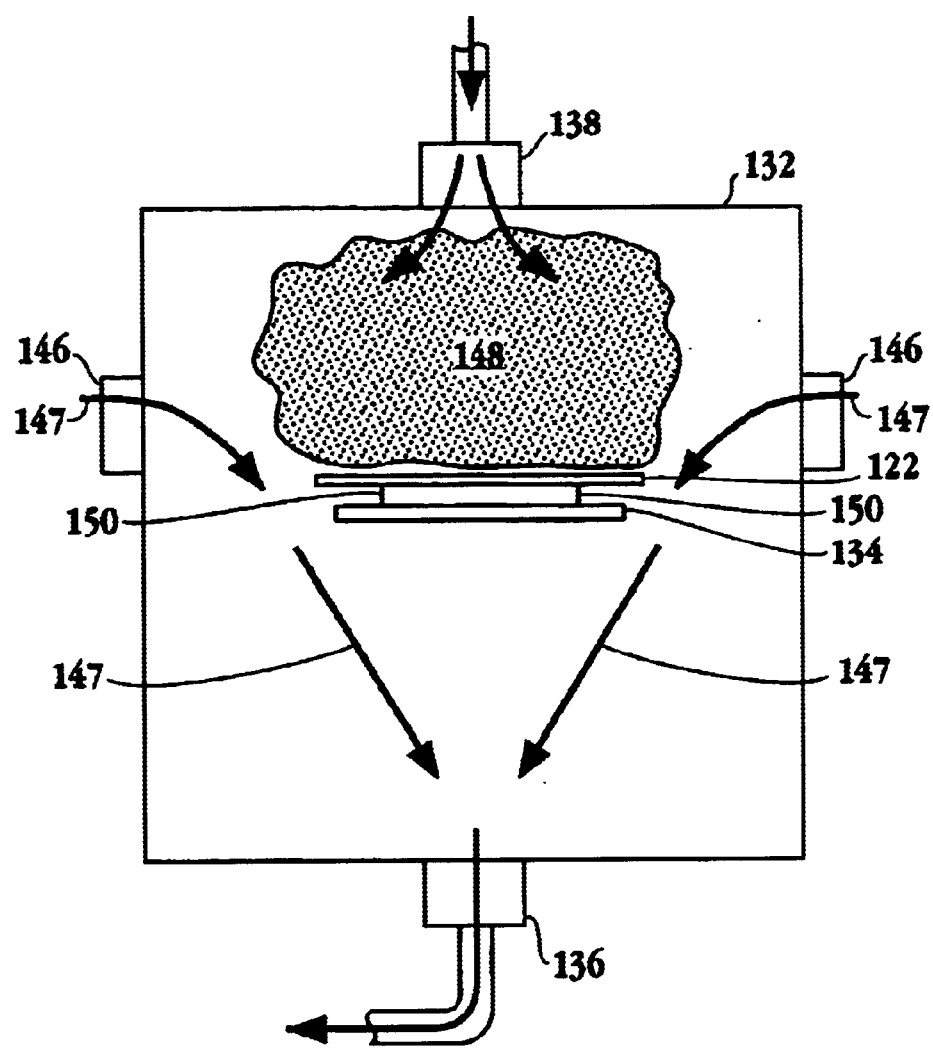
FIG. 3 is a simplified schematic diagram of a load lock with a top vent port and a bottom vacuum port in accordance with one embodiment of the invention.

FIG. 3 is a simplified schematic diagram of a load lock with a top vent port and a bottom vacuum port in accordance with one embodiment of the invention. Load lock 132 includes top vent port 138 and bottom vacuum port 136. Access ports 146 allow a wafer 122 to transfer into and out of load lock 132. When wafer 122 is inside load lock 132, the wafer rests on substrate support 134 having pins 150. For example, as a wafer is introduced into load lock 132 from an atmospheric transfer module, one of the access ports 146 will open to allow wafer 122 to enter the load lock. As one of the access ports 146 opens to allow entrance of wafer 122, a fluid flow is provided through vent port 138 into load lock 132. The fluid continues to flow as wafer 122 is moved into load lock 132 until access ports 146 are closed. In one embodiment, the fluid continues to flow for a short time period after access port 146 is closed. It should be appreciated that when access ports 146 are shut, load lock 132 becomes isolated, therefore, a slight positive pressure may build up in the load lock prior to a vacuum pump initiating to create a vacuum.

As indicated in FIG. 3, the fluid from vent port 138 creates a region 148 substantially free of moisture. Region 148 is defined between wafer 122 and the top of load lock 132. In one embodiment, vent port 138 is in communication with a diffuser for dispersing a fluid from the vent port throughout region 148 as will be shown in more detail with reference to FIGS. 5 and 6. The flow of gas through vent port 138 purges away moisture entering load lock 132 when access ports 146 are open during wafer transport. That is, any moisture laden air entrained with the activity from the movement of a wafer into and out of load lock 132 is forced below wafer 122 as indicated by arrows 147. In one embodiment the fluid vented into load lock 132 through vent port 138 is an inert non-toxic gas such as nitrogen, argon, helium, etc. Additionally, the flow of gas from vent port 138 forces any existing moisture from region 148 defined above wafer 122 to a region below wafer 122. Thus, existing internal moisture is removed from region 148 while external moisture is prevented from permeating region 148 of load lock 132.

Still referring to FIG. 3, once wafer 122 has been placed into load lock 132 from an atmospheric transfer module, the robot arm carrying the wafer is removed and access port 146, through which the wafer is introduced into the load lock, is closed. As mentioned above, the flow of gas through vent port 138 may continue for a brief time period after access ports 146 have been shut. Alternatively, the flow of gas through vent port 138 may stop as soon as access ports 146 are shut. In order for wafer 122 is to be transferred to a processing chamber through a vacuum transfer module, load lock 132 must be pumped out to create a vacuum. Thus, a vacuum pump, in communication with vacuum port 136, creates a vacuum in load lock 132 in one embodiment. It will be apparent to one skilled in the art that since region 148 is substantially free of moisture, the rate at which vacuum is pulled in load lock 132 is no longer restricted. That is, there is no need to perform a two-step vacuum process because there is no moisture above the surface of wafer 122. If the dew point temperature is crossed while pumping out load lock 132, moisture outside of region 148 may condense. For example, any moisture forced below wafer 122 may condense. However, the condensation is no longer a concern, as it is no longer in region 148 over wafer 122. Therefore, even if the moisture nucleates around a particle, the moisture and the particle will fall to the bottom surface of load lock 132. Furthermore, any particles which have fallen to the bottom of load lock 132, remain at the bottom of the load lock since vent port 138 is located at the top of load lock 132. That is, any particles on the bottom of load lock 132 are not kicked up during venting operations since vent port 138 is located at the top of the load lock. One skilled in the art will appreciate that the gas used to vent into load lock 132, such as nitrogen, is substantially free from moisture and highly filtered to avoid introducing particulate matter into the load lock.

Figure 4:
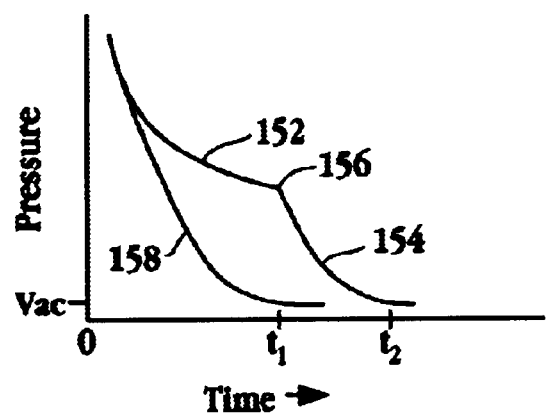
FIG. 4 is a graph that compares a two stage pump down where the first stage is restricted against an unrestricted vacuum pull down rate.

FIG. 4 is a graph that compares a two stage pump down where the first stage is restricted against an unrestricted vacuum pull down rate. The restricted vacuum pull down rate is represented by lines 152 and 154. During a first stage of the restricted vacuum pull down rate, represented by line 152, care is taken so as to not cross the dew point. Once point 156 is reached, the vacuum pull down rate may be increased, as shown by the initial slope of line 154, since the dew point is avoided by the two stage process. Therefore, a condensation cloud will not form, but throughput suffers with this two stage process. Additionally, the slow pump for the first stage reduces turbulence that can stir up any particles as lower pressure atmospheres are less able to move particles. Therefore, a one stage process is configured to pump the load lock without stirring up particulate matter.

On the other hand, line 158 represents an unrestricted vacuum pull down rate. For example, where moisture has been precluded or substantially removed from a region defined above a wafer, such as region 148, as discussed with reference to FIG. 3, the unrestricted pull down rate can be applied. By providing a gas purge through top vent port 138, the vacuum pull down rate can be increased, since the environment above the wafer is able to be conditioned to be substantially free from moisture. It should be appreciated that the gas used to purged the environment above the wafer is a dry gas. That is, crossing the dew point is no longer a concern due to the displacement of moisture above the wafer by a dry inert gas being vented through the chamber top. Thus, the time to reach the vacuum state within the load lock is less for the unrestricted vacuum pull down rate, as represented by time t1. One skilled in the art will appreciate that the valve system associated with the unrestricted pull down rate is less complex, therefore, the valve system associated with the unrestricted vacuum pull down rate will be less expensive. While the restricted vacuum pull down rate, utilizing a two stage process to avoid crossing the dew point, does not reach the desired vacuum level until time t2. The less time to pump out a chamber of a pressure varying interface, such as a load lock, translates to a higher throughput, since the pressure varying interface can be cycled quicker between differing pressure states.

Figure 5:
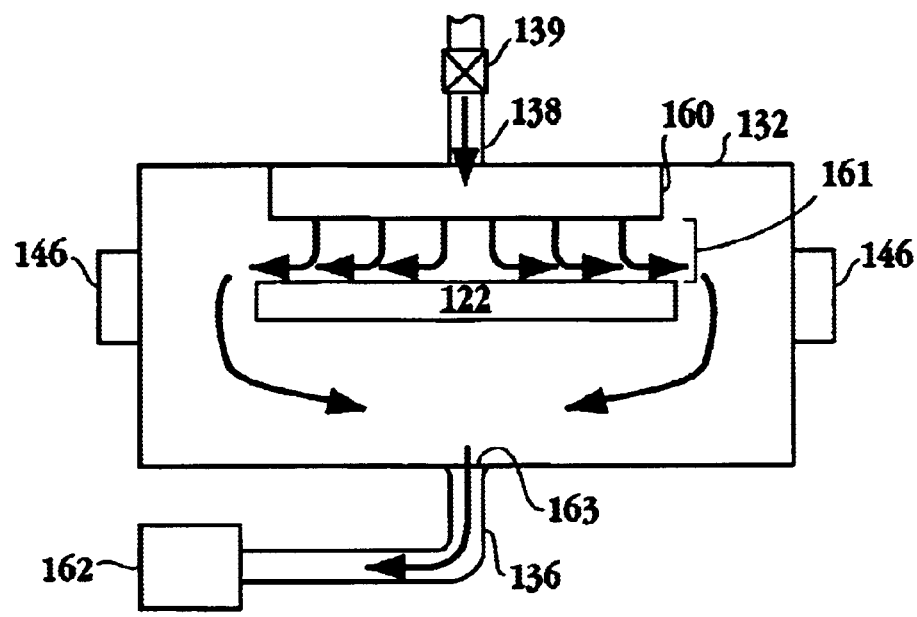
FIG. 5 is a schematic diagram of a load lock having a top vent port in communication with a diffuser in accordance with one embodiment of the invention.

FIG. 5 is a schematic diagram of a load lock having a top vent port in communication with a diffuser in accordance with one embodiment of the invention. Here, top vent port 138 connects to diffuser 160. Diffuser 160 directs the gas flow uniformly over a region defined above wafer 122 and below the diffuser, such as region 148 of FIG. 3. Thus, a sweeping fluid flow is created over wafer 122, thereby conditioning the environment above the wafer. That is, the inert gas flow from diffuser 160 displaces any moisture above wafer 122 and in effect provides an inert gas environment above the wafer. Diffuser 160 is shown as having a diameter slightly larger than wafer 122, however, it should be appreciated that the diameter of the diffuser can be smaller than the diameter of the wafer. Furthermore, the diffuser and be any shape suitable for creating a substantially moisture free environment above the wafer. Additionally, if any one of access ports 146 are opened, moisture-containing air that enters load lock 132 is directed below wafer 122. The inert gas purge from vent port 138 prevents external moisture from entering the region defined above wafer 122 and below diffuser 160 in a similar manner as discussed with respect to FIG. 3. Hence, the vacuum pull down rate can be increased. While vacuum port outlet 136 is shown substantially centered under wafer 122, it should be appreciated that the vacuum port outlet can be located anywhere on the bottom surface of load lock 132. Additionally, edge 164 is shown as a rounded corner to assist in pumping out the chamber. Vacuum pump 162, which evacuates load lock 132 to create a vacuum, can be any commercially available vacuum pump suitable for load lock 132. Diffuser 160 is rigidly attached to the top inside surface of load lock 132 in one embodiment. It will be apparent to one skilled in the art that while vent port 138 is shown as centered over wafer 122, the vent port can be located at any position of the chamber top, as long as a gas flow that provides an environment substantially free from moisture and particles above the wafer, can be delivered.

Still referring to FIG. 5, distance 161 between a top surface of wafer 122 and a bottom surface of diffuser 160 is between about 3 millimeters (mm) and about 3 centimeters (cm) in one embodiment. In a preferred embodiment, distance 161 is between about 5 mm and 2 cm and more preferably distance 161 is about 1 cm. As mentioned above, vacuum pump 162 can start as soon as access ports 146 are shut or a short time period thereafter. In one embodiment, vacuum pump 162 starts between about 0 and about 2 seconds after access ports 146 are closed. Preferably, vacuum pump 162 starts between about 0 and about 0.5 seconds after access ports 146 are closed. One skilled in the art will appreciate that while load lock 132 is being pumped out, vent port 138 is shut so that a vacuum can be pulled inside the load lock. It should be appreciated that any suitable valve 139 can be used to close access to vent port 138 to allow for a vacuum to be pulled inside load lock 132. Additionally, diffuser 160 can be any diffuser compatible with semiconductor operations, such as diffusers incorporating powdered metals, sintered nickel, expanded polytetrafluoroethylene (PTFE) membrane laminated to fabric and baffles, etc. It will be apparent to one skilled in the art that access ports 146 do not open at the same time as load lock 132 is a pressure varying interface between chambers at different pressures.

Figure 6:
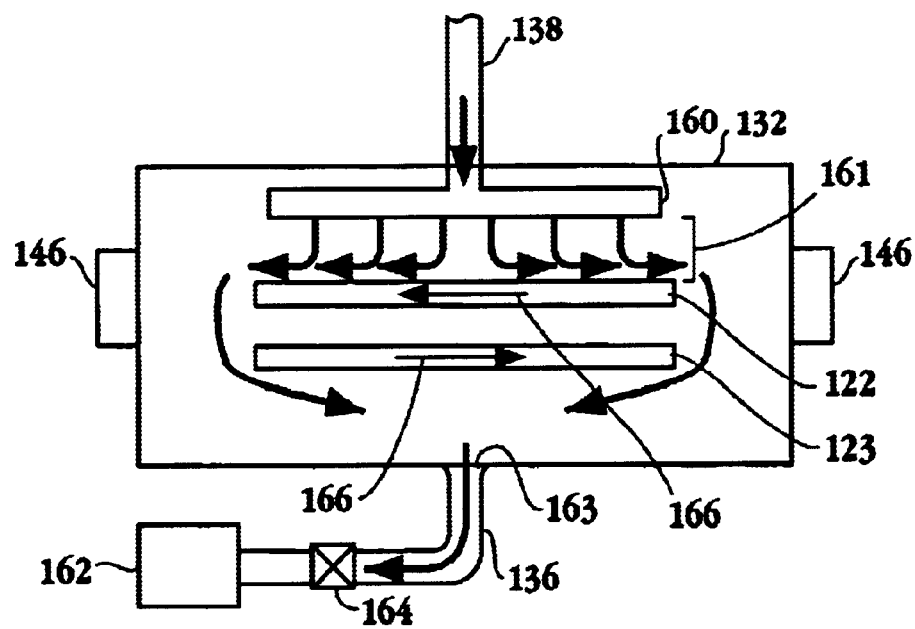
FIG. 6 is a schematic diagram of a load lock having a top vent port and a bottom vacuum port with multiple wafers inside the load lock in accordance with one embodiment of the invention.

FIG. 6 is a schematic diagram of a load lock having a top vent port and a bottom vacuum port with multiple wafers inside the load lock in accordance with one embodiment of the invention. Here, multiple wafers 122 and 123 are transitioning into and out of the load lock as depicted by arrows 166. One skilled in the art will appreciate that a processed wafer 123 may be introduced from a vacuum transfer module to load lock 132 while an unprocessed wafer 122 is inside load lock 132. Thus, the robotic arm depositing processed wafer 123 can then take wafer 122 to be processed. In one embodiment, one wafer is in load lock 132 during a venting in or pumping out operations. That is, two wafers are in load lock 132 when one of the access ports 146 are open. As discussed above, when an access port 146 is opened, gas flows through vent port 138 and diffuser 160 creating a region substantially free of moisture above top wafer 122. As wafer 122 moves into load lock 132, the flow of gas through diffuser 160 conditions the environment above the wafer. Additionally, the flow of clean dry gas radially fans out over the surface of wafer 122 in a sweeping motion. On the other hand, when processed wafer 123 enters load lock 132 when unprocessed wafer 122 is in the load lock, the flow of clean dry gas provides increased cooling for the processed wafer. Moreover, processed wafer 123 may off-gas, which can then condense on unprocessed wafer 122 and contaminate the unprocessed wafer. The flow provided by top vent 138 sweeps away any off-gassing and residues in a downward direction toward the bottom of load lock 132. It should be appreciated that the residues will be eventually pumped out through vacuum port 136 by vacuum pump 162. Another advantage of locating vent port 138 on top of the load lock 132 is that as a gas is vented into the load lock, particles resting on the bottom surface are not kicked up by the air flow into the load lock. When the vent port is located on the bottom of load lock 132, the particles can become entrained in the flow from the bottom vent and deposit onto the surface of any wafer present in load lock 132. However, by locating vent port 138 on top of load lock 132, particles on the bottom surface remain there.

Still referring to FIG. 6, the diameter of vent port 138 is about 100 mm in one embodiment. In one embodiment, where load lock 132 has a seven liter capacity, the flow rate of the clean dry gas, such as nitrogen, provided to the load lock through vent port 138 is between about 10 standard liters per minute (SLM) and about 100 SLM. The flow rate range for a seven liter chamber is preferably between about 40 SLM and about 60 SLM with a preferred flow rate of 50 SLM. While the flow rates are provided for a seven liter chamber it should be appreciated that the flow rate ranges can be scaled accordingly for larger or smaller chambers. One skilled in the art will appreciate that the embodiments discussed herein are temperature independent. In another embodiment, a vacuum state is achieved inside of load lock 132 in less than 10 seconds, preferably less than 6 seconds, from the initiation of the vacuum pull-down cycle. Of course, the vacuum pull down cycle can be initiated by starting vacuum pump 162 or by opening a suitable valve 164 between the suction side of the vacuum pump and load lock 132 when the vacuum pump is already running.

Figure 7:
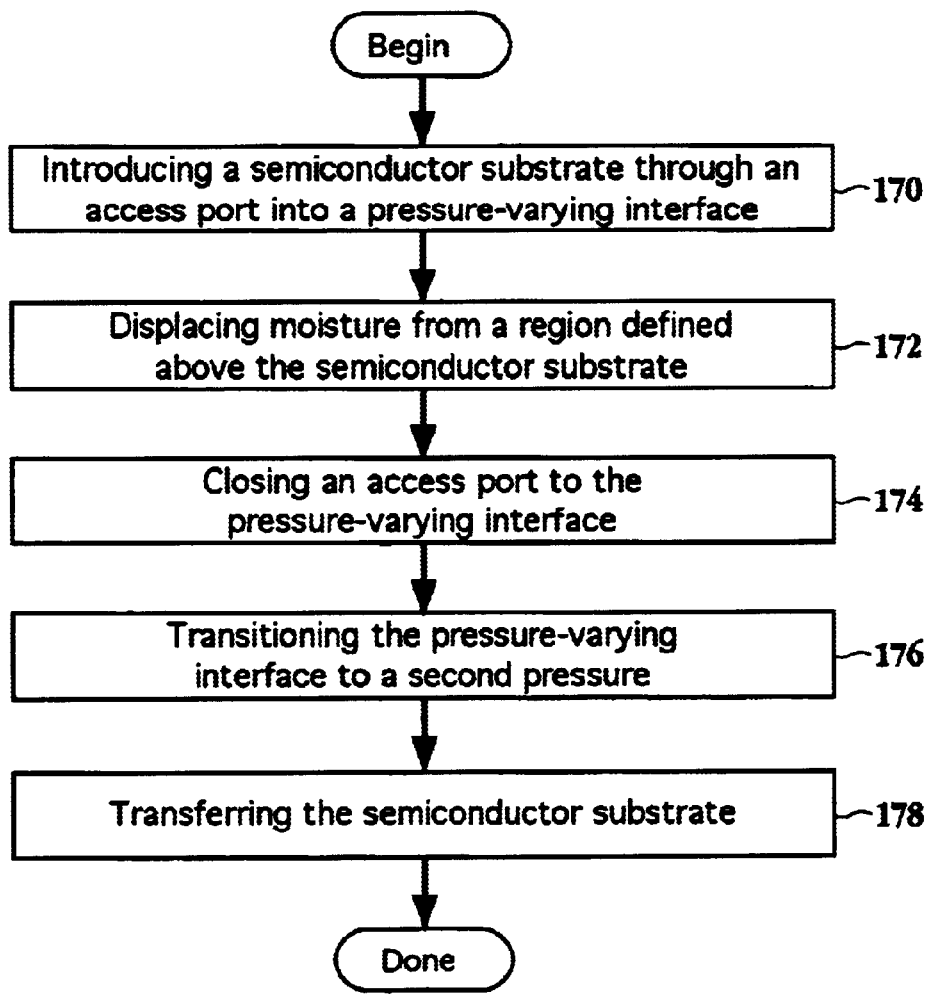
FIG. 7 is a flow chart diagram illustrating the method operations performed in conditioning an environment above a region of the semiconductor substrate within a pressure-varying interface.

FIG. 7 is a flow chart diagram illustrating the method operations performed in conditioning an environment above a region of the semiconductor substrate within a pressure-varying interface. The method initiates with operation 170 where a semiconductor substrate is introduced through an access port into a pressure-varying interface. Here, the pressure-varying interface is at a first pressure, such as atmospheric pressure when the semiconductor substrate is being transferred from an ATM. In one embodiment, the pressure varying interface is a load lock. The method then moves to operation 172 where moisture from a region defined above the semiconductor substrate is displaced. For example, a clean dry gas flow through a top vent port will displace the moisture from the region above the semiconductor substrate as discussed with reference to FIGS. 3, 5 and 6. As mentioned above the gas is any suitable inert, non-toxic gas. In addition, the flow of gas will prevent any external moisture from entering the region defined above the semiconductor substrate as an access port to the pressure-varying interface is opened. The displaced moisture as well as the external moisture entering through an open access port is forced below the semiconductor substrate. The method then advances to operation 174 where the access port is closed. It should be appreciated that prior to closing the access port, the semiconductor substrate is placed on a substrate support and a robot arm is removed from the pressure varying interface. It will be apparent to one skilled in the art that the access port can be any suitable access port providing access into the chamber with the capability of sealing the chamber, such as a slot valve.

Still referring to FIG. 7, the method then proceeds to operation 176 where the pressure-varying interface is transitioned to a second pressure. For example, after an unprocessed semiconductor substrate enters the pressure-varying interface from an atmospheric transfer module, the pressure within the pressure-varying interface will be brought down to vacuum from atmospheric pressure, which allows for the unprocessed semiconductor substrate to be transitioned to a vacuum transfer module. During the transitioning of the pressure-varying interface to a second pressure, a rate at which a vacuum is pulled inside the chamber is not restricted. That is, the region defined above the semiconductor substrate and below an inlet to the top vent port to the load lock is substantially free of moisture. In light of the lack of moisture above the substrate, condensation falling onto the surface of the semiconductor substrate is not a concern. It should be appreciated that the gas flow described in reference to operation 172 substantially removes the moisture from a region defined above the semiconductor substrate, thereby removing concerns related to condensation forming and nucleating around a particle above the semiconductor substrate. Thus, the dew point can be crossed by a rapid transition from atmospheric pressure to a vacuum. In turn, the throughput is increased because the load lock can be transitioned from a positive pressure to a vacuum without restriction. The method then advances to operation 178 where the semiconductor substrate is transferred out of the pressure varying interface. Here, the semiconductor substrate may be transferred to the vacuum transfer module for eventual transfer into a processing module.

Figure 8:
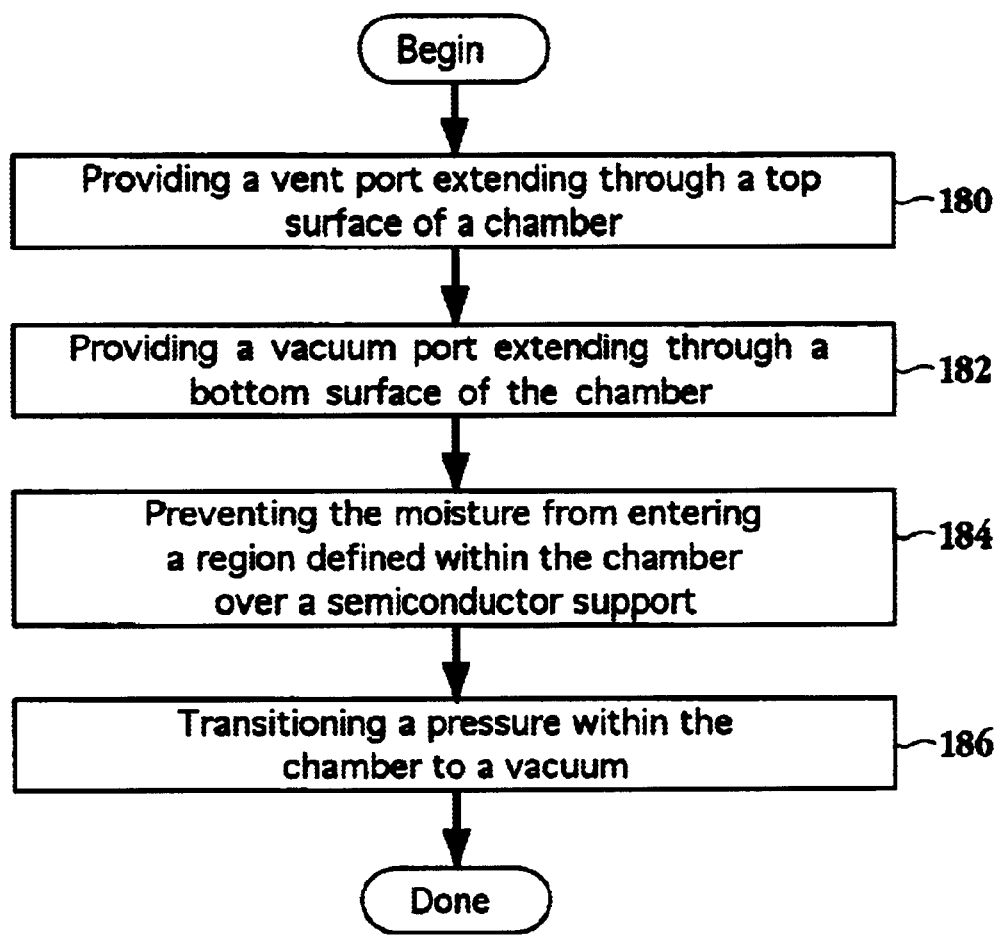
FIG. 8 is a flowchart diagram of the method operations for minimizing moisture in a region above a semiconductor substrate in a chamber in accordance with one embodiment of the invention.

FIG. 8 is a flowchart diagram of the method operations for minimizing moisture in a region above a semiconductor substrate in a chamber in accordance with one embodiment of the invention. The method initiates with operation 180 where a vent port extending through a top surface of the chamber is provided. Here, the vent port may be configured as those illustrated in FIGS. 3, 5 and 6. The method then proceeds to operation 182 where a vacuum port extending from a bottom surface of the chamber is provided. The vacuum port may be located at any position on the bottom surface of the chamber. In one embodiment, a vacuum pump in communication with the vacuum port provides the suction necessary to evacuate the chamber. The method then moves to operation 184 where moisture is prevented from entering a region defined within the chamber over a semiconductor substrate and under the vent port. For example, a gas flow may be provided through a vent port located on a top surface of the chamber. As discussed with respect to FIGS. 3, 5 and 6, the gas flow will prevent moisture from entering the region defined above a substrate within the chamber while an access port of the chamber is opened for the introduction or removal of a semiconductor substrate from the chamber. In particular, the gas flow creates a barrier to any air introduced into the chamber and forces the air to a region below the semiconductor substrate support in the chamber. In one embodiment, the gas is an inert, non-toxic gas, such as nitrogen.

The method of FIG. 8 then advances to operation 186 where a pressure within the chamber is transitioned to a vacuum. As moisture is prevented from the region above the semiconductor substrate and forced to regions below or to the side of the semiconductor substrate, if any condensation forms, it will form in the regions below or to the side of the semiconductor substrate. Since condensation over the semiconductor substrate is not a concern, the vacuum pull-down rate can be increased without creating turbulence and stirring up particles. Thus, the throughput of the system is improved since the chamber can be cycled between the pressure states more efficiently without impacting the quality of the semiconductor substrate.

In addition, during polysilicon etch operations, hydrogen bromide gas is swept away by the gas flow provided through the top vents in the embodiments described above. One skilled in the art will appreciate that the sweeping air flow from the top vent will prevent hydrogen bromide gas, given off by a processed wafer, from condensing on an unprocessed wafer. The nitrogen gas scrubs some of the hydrogen bromide off of the processed wafer, thereby minimizing the chances of cross contamination. Thus, locating the vent at the top of the chamber allows for blanketing the semiconductor substrate in a layer of an inert gas which protects the wafer from moisture condensation and from reactive species that off-gas from processed substrates. In one embodiment, the processed wafer is below the unprocessed wafer inside a load lock having multiple wafers.

In summary, the present invention provides a clean substantially moisture-free environment in a region above a substrate within a chamber and at the same time increases throughput by allowing a pressure varying interface such as a load lock to more efficiently cycle between pressure states. The invention has been described herein in terms of several exemplary embodiments. Other embodiments of the invention will be apparent to those skilled in the art from consideration of the specification and practice of the invention. The embodiments and preferred features described above should be considered exemplary, with the invention being defined by the appended claims.

What is claimed is:

1. A method for conditioning an environment in a region defined above a semiconductor substrate within a pressure varying interface, the method comprising:

introducing a semiconductor substrate through an open access port into a pressure varying interface, the pressure varying interface at a first pressure;

flowing an inert gas through a vent port extending through a top surface of the pressure varying interface during the semiconductor substrate introduction;

creating a moisture-free blanket of the inert gas in a region defined above the semiconductor substrate;

forcing external moisture entering the pressure varying interface towards a bottom surface of the pressure varying interface below the semiconductor substrate;

closing the open access port;

transitioning a pressure within the pressure varying interface to a second pressure; and transferring the semiconductor substrate.

2. The method of claim 1, wherein the second pressure is a vacuum state.

3. The method of claim 2, wherein the method operation of transitioning the pressure varying interface to a second pressure further includes:

evacuating the pressure varying interface through an outlet defined on a bottom surface of the pressure varying interface.

4. The method of claim 1, wherein the method operation of forcing external moisture entering the pressure varying interface towards a bottom surface of the pressure varying interface includes:

establishing a flow rate of the inert gas so as to allow flow of an external fluid into the pressure varying interface through the open access port.

5. The method of claim 4, wherein the vent port is located over a center region of the semiconductor substrate.

6. The method of claim 4, wherein the method operation of flowing a gas through a vent port extending through a top surface of the pressure varying interface further includes:

blanketing the semiconductor substrate with the inert gas to protect the semiconductor substrate from reactive species emanating from a processed semiconductor substrate simultaneously within the pressure varying interface.

7. A method for minimizing moisture in a region above a semiconductor substrate in a chamber, the method comprising:

introducing a fluid through a vent port extending through a top surface of a chamber;

introducing a semiconductor substrate into the chamber through an open access port;

entraining moisture in a flow of the fluid from a region defined over the semiconductor substrate to a region defined below the semiconductor substrate;

transitioning a pressure within the chamber to a vacuum; and causing condensation of the moisture forced to the region defined below the semiconductor substrate.

8. The method of claim 7, wherein the method operation of entraining moisture in a flow of the fluid from a region defined over the semiconductor substrate to a region defined below the semiconductor substrate further includes, establishing the flow of the fluid so as to allow flow of an external fluid containing water vapor into the pressure varying interface through the open access port.

9. The method of claim 8, wherein the fluid is an inert gas.

10. The method of claim 7, further including:

providing a diffuser above the region defined over the semiconductor substrate, the diffuser in communication with the vent port.

11. The method of claim 8, wherein the fluid flow rate is between about 10 standard liters per minute and 100 standard liters per minute.

12. The method of claim 10 wherein, a distance between a top surface of the semiconductor substrate and a bottom surface of the diffuser is between about 3 millimeters and about 3 centimeters.

13. A method for providing a substantially contamination-free environment above a semiconductor substrate within a pressure varying interface, the method comprising:

introducing an unprocessed semiconductor substrate through a first access port into a pressure varying interface;

introducing a processed semiconductor substrate through a second access port into the pressure varying interface;

flowing an inert gas through a vent port extending through a top surface of the pressure varying interface during the processed semiconductor substrate introduction;

establishing an inert gas blanket around the unprocessed semiconductor substrate;

forcing off-gassing residuals from the processed semiconductor substrate towards a bottom surface of the pressure varying interface below the semiconductor substrate; and transferring the unprocessed semiconductor substrate from the pressure varying interface through the second access port.

14. The method of claim 13, wherein the inert gas is nitrogen.

15. The method of claim 14, wherein the off-gassing residuals include hydrogen bromide.

16. The method of claim 14, wherein the method operation of introducing a processed semiconductor substrate through a second access port into the pressure varying interface includes, accessing the processed semiconductor from an etch chamber.

17. The method of claim 14, wherein the method operation of forcing off-gassing residuals from the processed semiconductor substrate towards a bottom surface of the pressure varying interface includes, scrubbing at least a portion of the off-gassing residuals through an interaction with the flowing inert gas.

* * * * *